United States Patent [19]

Satou et al.

[11] Patent Number: 5,151,613
[45] Date of Patent: Sep. 29, 1992

[54] LARGE SCALE INTEGRATED CIRCUIT DEVICE FOR SWITCHING OSCILLATION CIRCUIT

[75] Inventors: Hiroki Satou; Kazuyuki Horinouchi, both of Nara, Japan

[73] Assignee: Sharp Kabushiki Kaisha, Japan

[21] Appl. No.: 741,264

[22] Filed: Aug. 7, 1991

[30] Foreign Application Priority Data

Aug. 22, 1990 [JP] Japan ................... 2-88292[U]

[51] Int. Cl.⁵ ............... H03K 17/56; H03K 5/13; H03K 3/01; H01L 25/00
[52] U.S. Cl. ................. 307/243; 307/269; 307/482.1; 328/61; 331/49; 331/59
[58] Field of Search ........... 307/243, 303.1, 482.1; 328/61; 331/49, 59, 158, 116 R

[56] References Cited

U.S. PATENT DOCUMENTS

| | | | |
|---|---|---|---|
| 4,321,562 | 3/1982 | Igarashi | 331/158 |
| 4,370,625 | 1/1983 | Someshwar | 331/59 |
| 4,613,829 | 9/1986 | Ott | 331/59 |

*Primary Examiner*—Janice A. Howell
*Assistant Examiner*—Trong Phan
*Attorney, Agent, or Firm*—Nixon & Vanderhye

[57] ABSTRACT

An integrated circuit device having a CR oscillation circuit and a crystal oscillation circuit and capable of selecting either the CR oscillation circuit or the crystal oscillation circuit, includes a unit for receiving an electrical signal, and a unit for selecting either the CR oscillation circuit or the crystal oscillation circuit in accordance with a state of the electrical signal received by the receiving unit. The integrated circuit device also includes a unit for holding the receiving unit at a predetermined level of the electrical signal. The holding unit is adapted to hold the receiving unit at the predetermined level in accordance with a state of the receiving unit. The receiving unit is a selection terminal and the selecting unit is a selection circuit. The selection circuit includes a first analog switch and a second analog switch for controlling the crystal oscillation circuit, and an OR gate for controlling a selection of either the CR oscillation circuit or the crystal oscillation circuit in accordance with the electrical signal received at the selection terminal.

19 Claims, 2 Drawing Sheets

LARGE SCALE INTEGRATED CIRCUIT DEVICE FOR SWITCHING OSCILLATION CIRCUIT

BACKGROUND OF THE INVENTION

1. Field of the Invention

The present invention relates to a large scale integrated circuit device having a clock signal generating circuit built therein. In particular, the present invention is related to a large scale integrated circuit device which is capable of selecting either a CR oscillation circuit or a crystal oscillation circuit so that a user may use one of those oscillation circuits selectively according to the user's need.

2. Description of the Related Art

The inventors of the present invention know that there is a large scale integrated circuit device having a clock signal generating circuit built therein. This large scale integrated circuit device is arranged to select either a CR oscillation circuit or a crystal oscillation circuit by using metal layer masks respectively.

An arrangement of the above-mentioned known integrated circuit device is shown in FIG. 1. The integrated circuit device shown in FIG. 1 is composed of two kinds of metal layer masks, one kind of the metal layer masks being used for the CR oscillation circuit and the other kind of the metal layer masks being used for the crystal oscillation circuit, having respective circuit patterns as shown in FIGS. 2 and 3.

As shown in FIGS. 1 to 3, the above-mentioned known integrated circuit device includes a CR oscillation circuit 10, an oscillation inverter 11, a feedback resistor 12, a crystal oscillation circuit 13.

In the above-mentioned known integrated circuit device, the crystal oscillation circuit 13 includes the oscillation inverter 11 and the feedback resistor 12. Terminals 14 and 15 of the above-mentioned integrated circuit device are connected to a crystal oscillator (not shown) so that the integrated circuit device may output a predetermined signal.

In the connecting state shown in FIG. 2, the CR oscillation circuit 10 supplies an output signal as an internal clock CK. In the connecting state shown in FIG. 3, the crystal oscillation circuit 13 supplies an output signal as an internal clock CK as well.

However, above-mentioned known integrated circuit device requires two kinds of masks, one kind of masks for the CR oscillation circuit and the other kind of the masks for the crystal oscillation circuit in order to select either the CR oscillation circuit 10 or the crystal oscillation circuit 13. Moreover, a user must have two kinds of integrated circuits in order to use both of the CR oscillation and the crystal oscillation since they use different kinds of masks.

SUMMARY OF THE INVENTION

It is therefore an object of the present invention to provide a large scale integrated circuit device which is capable of selecting either a CR oscillation circuit or a crystal oscillation circuit composed in the same integrated circuit device having only one mask.

The object of the present invention can be achieved by an integrated circuit device having a CR oscillation circuit and a crystal oscillation circuit and capable of selecting either the CR oscillation circuit or the crystal oscillation circuit, includes a unit for receiving an electrical signal, and a unit for selecting either the CR oscillation circuit or the crystal oscillation circuit in accordance with a state of the electrical signal received by the receiving unit.

Preferably, the integrated circuit device further includes a unit for holding the receiving unit at a predetermined level of the electrical signal.

More preferably, the holding unit is adapted to hold the receiving unit at the predetermined level in accordance with a state of the receiving unit.

The receiving unit is preferably a selection terminal and the selecting unit is a selection circuit.

Further preferably, the selection circuit includes a first analog switch and a second analog switch for controlling the crystal oscillation circuit, and an OR gate for controlling a selection of either the CR oscillation circuit or the crystal oscillation circuit in accordance with the electrical signal received at the selection terminal.

The holding unit is a pull-up resistor connected to the selection terminal for holding the selection terminal at a predetermined level of the electrical signal.

The pull-up resistor is adapted to hold the selection terminal at Vcc level therethrough at a time when the selection terminal is open.

The CR oscillation circuit is adapted to supply a clock signal with a predetermined frequency in accordance with the selection circuit, preferably.

The CR oscillation circuit is so arranged that the CR oscillation circuit supplies the clock signal at a time when the selection terminal receives the electrical signal with Vcc level, preferably.

The CR oscillation circuit is so arranged that the CR oscillation circuit holds at a ground level at a time when the selection terminal receives the electrical signal with GND level, preferably.

Preferably, the crystal oscillation circuit includes an oscillation inverter and a feedback resistor.

More preferably, the first analog switch is adapted to control the oscillation inverter so that the oscillation inverter fixes an input terminal thereof at Vcc level at a time when an input signal thereto is at Vcc level.

Further preferably, the second analog switch is adapted to control the feedback resistor so as to disconnect the feedback resistor electrically at a time when the input signal is at GND level.

The OR gate is preferably adapted to perform a logical OR between an output signal of the CR oscillation circuit and an output signal of the crystal oscillation circuit.

Each of the first analog switch and the second analog switch includes a P-channel MOS transistor, a N-channel MOS transistor and an inverter, preferably.

The electrical signal is preferably an electrical voltage.

In operation, the selecting circuit is capable of selecting a proper one of the CR oscillation circuit and the crystal oscillation circuit depending on the voltage applied to the selection terminal. That is, the oscillation circuit can be selected not depending on the mask option but depending on the voltage of the selection terminal. It results in making it possible to obtain the same integrated device circuit having just one mask formed for both the CR oscillation and the crystal oscillation. Moreover, the users enable to select the type of the oscillation circuit in accordance their needs.

Further objects and advantages of the present invention will be apparent from the following description of

DESCRIPTION OF THE PREFERRED EMBODIMENTS

Referring with accompanying drawings, an embodiment of an integrated circuit device in accordance with the present invention will be described in details in the following parts.

Figure 1:
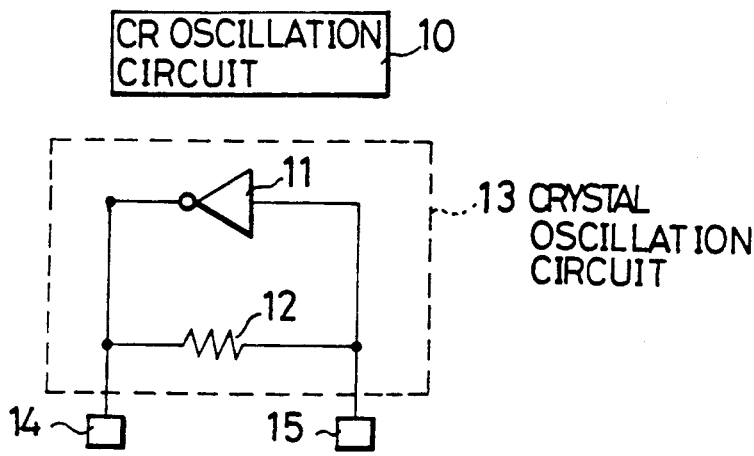
FIG. 1 is a circuit diagram showing an integrated circuit device known by the present inventors.
Figure 2:
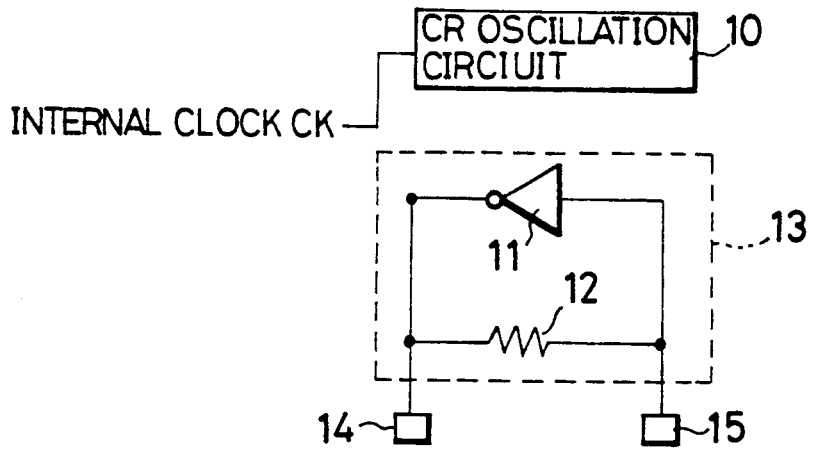
FIG. 2 is a circuit diagram showing a metal mask for a CR oscillation circuit included in the known integrated circuit device.
Figure 3:
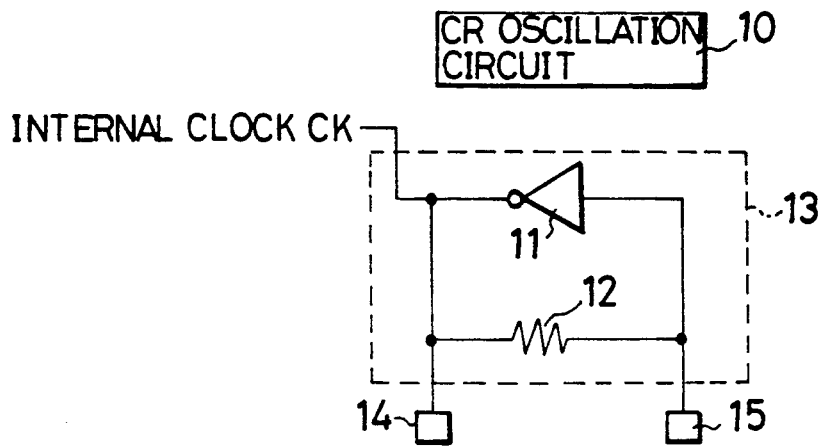
FIG. 3 is a circuit diagram showing a metal mask for a crystal oscillation circuit included in the known integrated circuit device.
Figure 4:
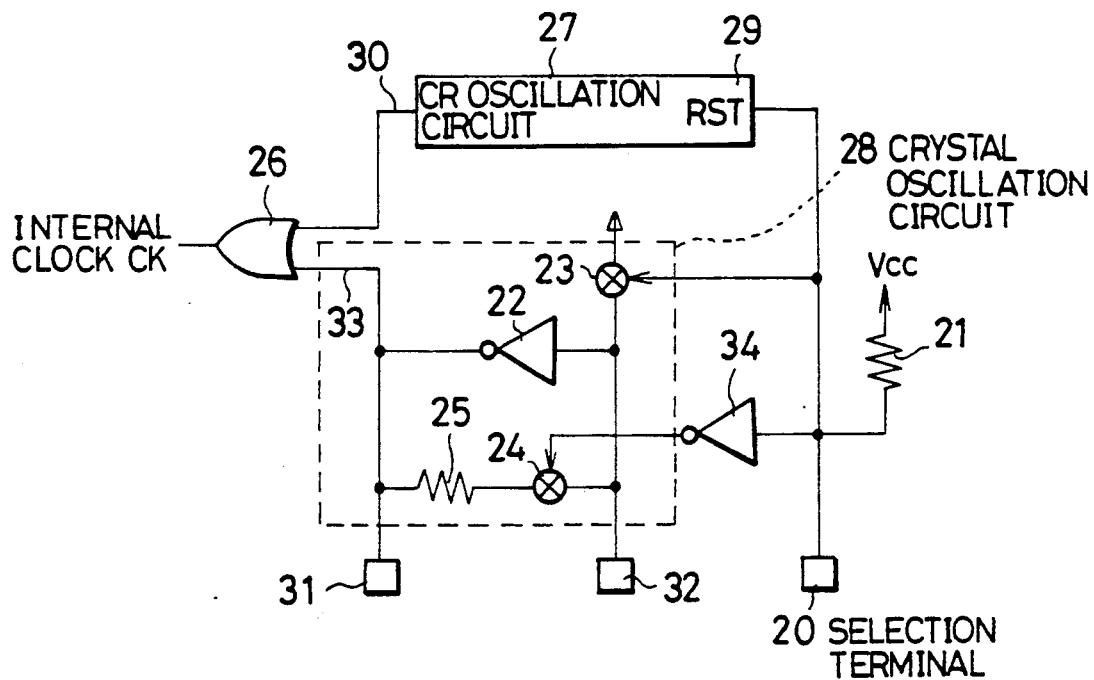
FIG. 4 is a circuit diagram showing an integrated circuit device according to an embodiment of the present invention.

FIG. 4 shows an arrangement of the integrated circuit device according to a first embodiment of the present invention.

The integrated circuit device shown in FIG. 4 includes a selection terminal 20, a pull-up resistor 21, an oscillation inverter 22, analog switches 23, 24, a feedback resistor 25, an OR gate 26, a CR oscillation circuit 27, and a crystal oscillation circuit 28. signal with a predetermined frequency to a signal line 30 when a signal of the Vcc voltage level is inputted to a reset input (RST) 29 or to fix the signal line 30 on the grounding level (GND level) when a signal of the GND level is inputted to the reset input 29.

The crystal oscillation circuit 28 includes the oscillation inverter 22, the analog switches 23, 24 and the feedback resistor 25.

The crystal oscillation circuit 28 serves to supply a clock signal with a predetermined frequency on the signal line 33 when a crystal oscillator (not shown) is connected between terminals 31 and 32.

The selection terminal 20 serves to select either one of the CR oscillation circuit 27 or the crystal oscillation circuit 28 and is arranged to keep the voltage at the Vcc level through the effect of the pull-up resistor 21 when the selection terminal 20 is open.

The analog switches 23, 24 are arranged to control the crystal oscillation circuit 28. The analog switch 23 serves to control the oscillation inverter 22. When the input signal is at the Vcc level, the analog switch 23 keeps the input terminal of the oscillation inverter 22 fixed at the Vcc level.

The analog switch 24 serves to control the feedback TQP resistor 25 and to connect the feedback resistor 25 electrically when the input signal is at the GND level.

The OR gate 26 is arranged to perform the logical OR between an output signal of the CR oscillation circuit 27 and an output of the crystal oscillation circuit 28. The resulting signal is an internal clock CK.

In the following, an operation of the integrated circuit device according to the above-mentioned embodiment will be described.

When the selection terminal 20 is open, the CR oscillation circuit 27 holds the voltage level of the reset input (RST) 29 at the Vcc level so that the clock signal CK is outputted to the signal line 30. Since the voltage Vcc is inputted to the analog switch 23, the oscillation inverter 22 fixes the input at the Vcc level and the signal line 33 is at the GND level.

The operation of the inverter 34 results in inputting the voltage at the GND level to the analog switch 24, thereby disconnecting the feedback resistor 25 electrically. Hence, the clock signal CK, which is generated in the CR oscillation circuit 27 as stated above, is outputted to the internal circuit.

When the selection terminal 20 is connected to the ground terminal, the CR oscillation circuit 27 holds the voltage of the reset input (RST) 29 at the GND level so that the signal line 30 is fixed at the GND level. Since the voltage at the GND level is inputted to the analog switch 23, the oscillation inverter 22 starts to be effective. The operation of the inverter 34 results in inputting the voltage at the Vcc level to the analog switch 24, the feedback resistor 25 is made effective so that the clock signal generated in the crystal oscillation circuit 28 is outputted to the internal circuit.

Figure 5:
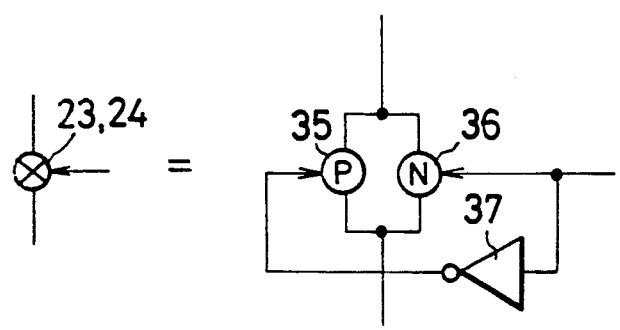
FIG. 5 is an circuit diagram showing an equivalent circuit of an analog switch shown in FIG. 4.

As shown in FIG. 5, the analog switch 23 (or the analog switch 24) includes a P-channel MOS transistor 35, an N-channel MOS transistor 36 and an inverter 37.

According to a second embodiment of the present invention, the integrated circuit device is arranged to select either one of the oscillation circuits 27, 28 by connecting the pull-up resistor 21 to the ground and the selection terminal 20 to a supply terminal or by holding the selection terminal 20 open, that is, at the GND level.

According to a third embodiment of the invention, the integrated circuit device is arranged to select either one of the oscillation circuits 27, 28 by removing the pull-up resistor 21 and by connecting the selection terminal 20 to the supply terminal or by connecting the selection terminal 20 to the ground.

Many widely different embodiments of the present invention may be constructed without departing from the spirit and scope of the present invention. It should be understood that the present invention is not limited to the specific embodiments described in the specification, except as defined in the appended claims.

What is claimed is:

1. An integrated circuit device having a CR oscillation circuit and a crystal oscillation circuit and capable of selecting either the CR oscillation circuit or the crystal oscillation circuit, said integrated circuit device comprising:
   means connected to said CR oscillation circuit for receiving an electrical signal;
   means connected to both of said CR oscillation circuit and said receiving means for selecting either said CR oscillation circuit or said crystal oscillation circuit in accordance with a state of said electrical signal received by said receiving means; and
   means connected to said receiving means for holding said receiving means at a predetermined level of said electrical signal in accordance with a state of said receiving means.

2. An integrated circuit device according to claim 1, wherein said receiving means being a selection terminal, and said selecting means being a selection circuit which includes an OR gate for controlling a selection of either said CR oscillation circuit or said crystal oscillation circuit in accordance with said electrical signal received at said selection terminal.

3. An integrated circuit device having a CR oscillation circuit and a crystal oscillation circuit and capable of selecting either the CR oscillation circuit or the crystal oscillation circuit, said integrated circuit device comprising:

means connected to said CR oscillation circuit for receiving an electrical signal;

means connected to both of said CR oscillation circuit and said receiving means for selecting either said CR oscillation circuit or said crystal oscillation circuit in accordance with a state of said electrical signal received by said receiving means; and means connected to said receiving means for holding said receiving means at a predetermined level of said electrical signal in accordance with a state of said receiving means, said receiving means being a selection terminal, and said selecting means being a selection circuit which includes an OR gate for controlling a selection of either said CR oscillation circuit or said crystal oscillation circuit in accordance with said electrical signal received at said selection terminal.

4. An integrated circuit device according to claim 3, wherein said holding means is pull-up resistor connected to said selection terminal for holding said selection terminal at a predetermined level of said electrical signal.

5. An integrated circuit device according to claim 4, wherein said pull-up resistor holds said selection terminal at Vcc level therethrough at a time when said selection terminal is open.

6. An integrated circuit device according to claim 5, wherein said CR oscillation circuit supplies a clock signal with a predetermined frequency in accordance with said selection circuit.

7. An integrated circuit device according to claim 6, wherein said CR oscillation circuit is so arranged that said CR oscillation circuit supplies said clock signal at a time when said selection terminal receives said electrical signal with Vcc level.

8. An integrated circuit device according to claim 7, wherein said CR oscillation circuit is so arranged that said CR oscillation circuit holds at a ground level at a time when said selection terminal receives said electrical signal with GND level.

9. An integrated circuit device according to claim 3, wherein said crystal oscillation circuit includes a first analog switch and a second analog switch connected to both of said CR oscillation circuit and said receiving means for controlling said crystal oscillation circuit, an oscillation inverter connected to both of said first analog switch and said second analog switch, and a feedback resistor connected to both of said oscillation inverter and said second analog switch.

10. An integrated circuit device according to claim 9, wherein said first analog switch controls said oscillation inverter so that said oscillation inverter fixes an input terminal of said oscillation inverter at Vcc level at a time when an input signal to said oscillation inverter is at Vcc level.

11. An integrated circuit device according to claim 10, wherein said second analog switch controls said feedback resistor so as to connect said feedback resistor electrically at a time when said input signal is at GND level.

12. An integrated circuit device according to claim 11, wherein said OR gate performs a logical OR between an output signal of said CR oscillation circuit and an output signal of said crystal oscillation circuit.

13. An integrated circuit device according to claim 9, wherein each of said first analog switch and said second analog switch includes a P-channel MOS transistor, a N-channel MOS transistor and an inverter.

14. An integrated circuit device according to claim 3, wherein said electrical signal is an electrical voltage.

15. An integrated circuit device having a CR oscillation circuit and a crystal oscillation circuit, the crystal oscillation circuit receiving a clock signal, the integrated circuit device being capable of selecting either the CR oscillation circuit or the crystal oscillation circuit, said integrated circuit device comprising:

an output gate from which a selected oscillation signal is outputted;

means connected to said CR oscillation circuit for receiving an electrical signal and whereby, if the state of the electrical signal indicates selection of the CR oscillation circuit, the CR oscillation circuit outputs its output signal to the output gate as the selected oscillation signal;

an oscillator inverter included in the crystal oscillation circuit and a feedback loop connecting input and output terminals of the oscillator inverter, the output terminal of the oscillating inverter also being connected to the output gate;

first control means included in the crystal oscillation circuit and responsive to the received electrical signal, the first control means being connected to the oscillator inverter for controlling an output signal from the oscillating inverter whereby, if the state of the electrical signal indicates selection of the crystal oscillation circuit, a clock signal received by the crystal oscillation circuit is output to the output gate.

16. The apparatus of claim 15, further comprising:
second control means included in the crystal oscillation circuit and responsive to the received electrical signal, the second control means controlling a feedback loop to the oscillation inverter.

17. The apparatus of claim 16, wherein the first control means and the second control means are analog switches.

18. The method of claim 16, wherein the electrical signal is used to control first switching means and second switching means included in the crystal oscillation circuit, wherein the first switching means is in turn used to control the oscillation inverter, and wherein the second switching means is used to control a feedback loop to the oscillation inverter.

19. A method of selecting between an output signal of a CR oscillation circuit and a crystal oscillation circuit, the CR oscillation circuit and the crystal oscillation circuit both being included in an integrated circuit, the method comprising:

receiving an electrical signal having a state indicative of a selection between the CR oscillation circuit and the crystal oscillation circuit;

applying the electrical signal to the CR oscillation circuit whereby, if the state of the electrical signal indicates selection of the CR oscillation circuit, the CR oscillation circuit outputs its output signal to an output gate;

using the electrical signal to control an oscillation inverter included in the crystal oscillation circuit whereby, if the state of the electrical signal indicates selection of the crystal oscillation circuit, a clock signal generated by the crystal oscillation circuit is output to the output gate.

* * * * *